United States Patent [19]

Clelland

[11] 4,094,762
[45] June 13, 1978

[54] METHOD FOR THE STORAGE OF MATERIAL

[75] Inventor: David Watson Clelland, Appleton, England

[73] Assignee: United Kingdom Atomic Energy Authority, London, England

[21] Appl. No.: 628,783

[22] Filed: Nov. 4, 1975

Related U.S. Application Data

[63] Continuation of Ser. No. 524,995, Nov. 18, 1974, abandoned.

[30] Foreign Application Priority Data

Nov. 5, 1974 United Kingdom ............... 47792/74

[51] Int. Cl.$^2$ .......................... C23C 15/00; G21F 9/02
[52] U.S. Cl. .......................... 204/192 EC; 204/192 SP; 204/192 N
[58] Field of Search ................... 204/192, 298, 192 N, 204/192 EC, 192 SP; 252/301.1 W

[56] References Cited

U.S. PATENT DOCUMENTS

| | | | |
|---|---|---|---|
| 3,294,669 | 12/1966 | Theurer | 204/298 |
| 3,326,178 | 6/1967 | De Angelis | 118/49.1 |
| 3,463,715 | 8/1969 | Bloom | 204/192 |
| 3,486,935 | 12/1969 | Eyrich | 204/192 X |

OTHER PUBLICATIONS

W. R. Wormald et al., "The Preparation of Tantalum Nitride Targets by Reactive Sputtering, " *Nuclear Instruments and Methods,* Mar. 1973, pp. 233–235.

*Primary Examiner*—Aaron Weisstuch
*Attorney, Agent, or Firm*—Larson, Taylor and Hinds

[57] ABSTRACT

A method for storage of a material comprising:
providing an electrical glow discharge device comprising a container for enclosing a gas atmosphere, said container including a wall forming a storage glow discharge electrode, and a sacrificial glow discharge electrode located within said container;
introducing into said container a gas atmosphere containing the material to be stored;
maintaining the pressure within said container at a value suitable for electrical glow discharge;
electrically energizing the storage and sacrificial glow discharge elctrodes to effect glow discharge between the electrodes to ionize said material in said atmosphere;
controlling the electrical supply such that ions of said material bombard and are implanted into said wall forming said storage electrode and such that ions of said material also bombard said sacrificial electrode, the iom bombardment of said sacrificial electrode being sufficient to cause sputtering thereof such that the sputtered material is deposited on said wall forming said storage electrode;
whereby the thickness of said wall is increased and whereby ions of said material to be stored are implanted in the container wall of increased thickness such that said material is entrapped and stored therein.

6 Claims, 1 Drawing Figure

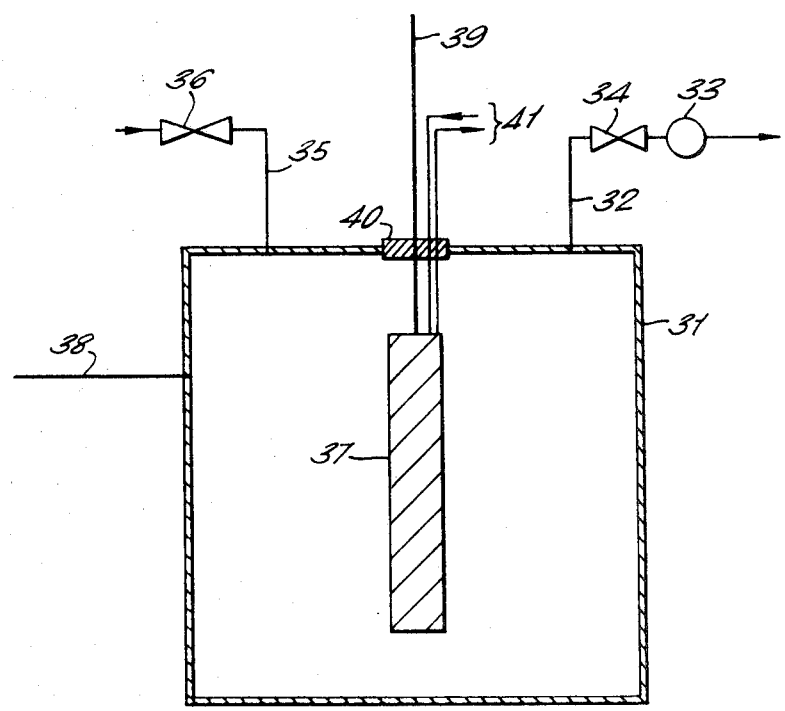

METHOD FOR THE STORAGE OF MATERIAL

This application is a continuation of co-pending application Ser. No. 524,995, filed Nov. 18, 1974 and now abandoned.

The present invention relates to the storage of material and finds a particular application in the storage of noxious or radioactive materials.

In co-pending application Ser. No. 524,996, filed Nov. 18, 1974, now U.S. Pat. No. 4,051,063 issued Sept. 22, 1977 there is disclosed inter alia a method for the convenient storage of material, especially noxious or radioactive material, comprising entrapping the material within a solid by bombarding the solid with ions of the material so as to form a concentration of the material within the solid.

Also in the provisional specification relating to the above numbered patent application there is disclosed apparatus for carrying out the above method.

The present invention is a modification of the invention disclosed in co-pending application Ser. No. 524,996.

According to the present invention there is provided apparatus for use in entrapping a material to be stored within a solid by bombarding the solid with ions of the material so as to form a concentration of the material within the solid, comprising a sealable container for enclosing an atmosphere containing material to be stored and adapted to provide one electrode of a discharge system and an electrode within the container adapted to form a second electrode of a discharge system, the arrangement being such that the electrodes can be so energised from an electrical supply that ions of the material to be stored can be implanted and the material thereby entrapped in a wall of the sealable container.

Preferably the container is substantially a right circular cylinder in shape.

The invention will now be described by way of example with reference to the single figure of the accompanying drawing which shows a diagrammatic representation of an apparatus for implanting a material into a solid and building up the solid by sputtering.

Referring now to the drawing, a cylindrical container 31, composed of a conductive solid capable of entrapping a gaseous material, is provided with a pipe 32 communicating with the interior of the container 31 and connected to a vacuum system 33 via a valve 34.

A pipe 35 is provided having a control valve 36. The pipe 35 communicates with the interior of the container 31 and is adapted for the introduction of gaseous material into the interior of the container 31.

An electrode 37, also composed of a conductive solid capable of entrapping a gaseous material, is located within and supported by the container 31. The container 31 and electrode 37 are connected to a high voltage electrical supply (not shown) by means of conductors 38 and 39 respectively. Alternatively the container 31 may be maintained at earth potential. The electrode 37 is insulated from the container 31 by insulation 40.

To dissipate heat generated when the apparatus is in operation, the electrode 37 and the container 31 are provided with cooling means. In the case of the electrode 37 the cooling means comprises means for recirculating a coolant medium therethrough represented by 41. In the case of the container 31 the cooling means is a jacket (not shown) surrounding the container 31 and means (not shown) for circulating a coolant medium through the jacket.

In operation the container 31 is first evacuated to a pressure of about 100 microns by means of the pipe 32, vacuum system 33, and the valve 34.

Subsequently the gaseous material to be implanted and thereby entrapped in a solid, e.g. krypton containing the isotope krypton-85, is introduced into the container 31 by means of the pipe 35 and valve 36 so as to surround the electrode 37. Valve 36 may be controlled automatically by the pressure in the container 31 so that gaseous material is introduced to make up for that which is implanted into the solid. It is to be understood that in some circumstances, it may be necessary to pump continuously from the container 31 in order to maintain the required reduced pressure therein.

From the foregoing description it will be appreciated that the electrode 37 and the container 31 constitute two electrodes of an electrical discharge system. Thus by controlled use of an electrical supply to the electrode 37 and the container 31 (by means of conductors 39 and 38 respectively) or to the electrode 37, if the container 31 is at earth potential, an electrical glow discharge occurs through the gaseous material with the result that gaseous material is implanted into the electrode 37 and the walls of the container 31.

As is mentioned in co-pending application Ser. No. 524,996, the implantation of ions into a solid material is accompanied by sputtering of the solid material. By controlling the electrical supply (e.g. so that one electrode receives say, 4 times the discharge of the other electrode) the inner surface of the container 31 is built up by material sputtered from the electrode 37. This means that electrode 37 performs a "sacrificial" role and is eroded, the gaseous material implanted therein being released to the interior of the container 31 whilst the thickness of the walls of the container 31 increases and gaseous material is entrapped within the walls.

Control of the electrical supply can be, for example, by adjusting the value and/or polarity of potential applied to a particular electrode and/or the time for which potential is applied to a particular electrode in accordance with electrical discharge technology.

After the desired amount of gaseous material has been implanted the supply of radioactive gas to the container 31 can be interrupted and in the case of a radioactive gas such as krypton containing the isotope krypton-85, an atmosphere of non-radioactive gas (e.g. non-radioactive krypton or argon) introduced into the container 31. Thus the walls can be given a final treatment to provide a non-radioactive gas layer adjacent to the surface. Non-radioactive gas can be used to sputter material onto the walls to provide a final layer of material containing substantially no radioactive gas.

When the walls have been built up to the desired amount and the desired amount of gaseous material has been entrapped therein the container 31 is disconnected from the vacuum system 33, supply pipe 35, cooling means supply 41 and electrical supply 38, 39 and is removed for storage.

It is to be understood that in the apparatus hereinbefore described the electrodes are represented diagrammatically and that in practice electrode geometry and electrode shielding would be chosen in accordance with "glow discharge" technology to suit particular requirements and to cause the discharge to occur in the desired region.

Statements made in the above identified application in relation to FIG. 1 thereof concerning simultaneous implantation and build up, and alternate implantation and build up, also apply to the present invention.

EXAMPLE 1

To demonstrate the feasibility of using a cylindrical geometry electrode system, argon was implanted into nickel using nickel cylindrical electrodes.

The inner electrode was of 1.25 cm diameter and the outer electrode was of 3.25 cm diameter, both were of 40 cm length.

With an electrical supply which delivered 10 mA at 3 kV connected to the electrodes and an argon atmosphere at 80 microns pressure surrounding the electrodes the deposition rate of nickel sputtered from the inner electrode was $8.7 \times 10^{-5}$ gm/cm$^2$/mA hour.

Using the same electrodes but 20 mA at 1.6 kV and 100 microns pressure the deposition rate was $1.83 \times 10^{-5}$ gm/cm$^2$/mA hour.

EXAMPLE 2

Argon was also implanted into nickel using cylindrical electrodes of 17.5 mm and 70 mm diameter respectively, both 40 mm in length, and 10 mA at 3 kV under 100 microns pressure. The deposition rate was not measured.

I claim:

1. A method for storage of a material comprising:
providing an electrical glow discharge device comprising a container for enclosing a gas atmosphere, said container including a wall forming a storage glow discharge electrode, and a sacrificial glow discharge electrode located within said container;
introducing into said container a gas atmosphere containing the material to be stored;
maintaining the pressure within said container at a value suitable for electrical glow discharge;
electrically energizing the storage and sacrificial glow discharge electrodes to effect glow discharge between the electrodes to ionize said material in said atmosphere;
controlling the electrical supply such that ions of said material bombard and are implanted into said wall forming said storage electrode and such that ions of said material also bombard said sacrificial electrode, the ion bombardment of said sacrificial electrode being sufficient to cause sputtering thereof such that the sputtered material is deposited on said wall forming said storage electrode;
whereby the thickness of said wall is increased and whereby ions of said material to be stored are implanted in the container wall of increased thickness such that said material is entrapped and stored therein.

2. A method according to claim 1 wherein said controlling of the electrical supply comprises adjusting at least one parameter of value, polarity and time of potential applied to a particular electrode.

3. A method according to claim 1 wherein said material to be stored comprises a radioactive material.

4. A method according to claim 1 further including the step of introducing additional material to be stored into said container for storage of additional material in said container wall.

5. A method according to claim 1 wherein said material to be stored is noxious and wherein, after implantation of said noxious material in said container wall, a non-noxious gas atmosphere is provided in said container whereby a layer of ions of said non-noxious gas atmosphere is implanted in said container wall.

6. A method according to claim 5 wherein said noxious material comprises a radioactive isotope.

* * * * *